United States Patent
Mauder et al.

(10) Patent No.: US 8,933,533 B2
(45) Date of Patent: Jan. 13, 2015

(54) SOLID-STATE BIDIRECTIONAL SWITCH HAVING A FIRST AND A SECOND POWER-FET

(75) Inventors: Anton Mauder, Kolbermoor (DE); Mario Feldvoss, Munich (DE)

(73) Assignee: Infineon Technologies Austria AG, Villach (AT)

( * ) Notice: Subject to any disclaimer, the term of this patent is extended or adjusted under 35 U.S.C. 154(b) by 327 days.

(21) Appl. No.: 13/541,876

(22) Filed: Jul. 5, 2012

(65) Prior Publication Data

US 2014/0009189 A1  Jan. 9, 2014

(51) Int. Cl.
H01L 29/78 (2006.01)
H01L 29/423 (2006.01)
H01L 29/778 (2006.01)

(52) U.S. Cl.
CPC ...... H01L 29/42316 (2013.01); H01L 29/7786 (2013.01)
USPC ........... 257/500; 257/505; 257/328; 257/330; 257/E29.262; 257/E31.049

(58) Field of Classification Search
CPC . H01L 29/2003; H01L 29/78; H01L 29/7786; H01L 29/42316
USPC ............ 257/500, 505, 328, 330, E27.014, 49, 257/29.262
See application file for complete search history.

(56) References Cited

U.S. PATENT DOCUMENTS

| | | |
|---|---|---|
| 4,477,742 A | 10/1984 | Janutka |
| 4,680,490 A | 7/1987 | Baker et al. |
| 5,003,246 A | 3/1991 | Nadd |
| 6,705,441 B1 * | 3/2004 | Boys et al. ........................ 191/10 |
| 6,876,245 B2 | 4/2005 | de Buda |
| 7,157,747 B2 * | 1/2007 | Mariyama et al. ............. 257/119 |
| 7,459,365 B2 | 12/2008 | Rueb et al. |
| 7,821,033 B2 * | 10/2010 | Sedlmaier et al. ............. 257/192 |
| 7,999,311 B2 | 8/2011 | Werner |
| 8,319,205 B2 * | 11/2012 | Bertin et al. ...................... 257/24 |
| 8,334,563 B2 * | 12/2012 | Takahashi ..................... 257/328 |
| 8,541,833 B2 * | 9/2013 | Schulze et al. ................ 257/328 |
| 8,749,018 B2 * | 6/2014 | Stecher et al. ................ 257/500 |
| 2008/0067626 A1 | 3/2008 | Hirler et al. |
| 2008/0143421 A1 * | 6/2008 | Yanagihara et al. .......... 327/427 |

(Continued)

FOREIGN PATENT DOCUMENTS

| | | |
|---|---|---|
| DE | 3688438 T2 | 10/1993 |
| DE | 102005039331 A1 | 2/2007 |

(Continued)

*Primary Examiner* — Michael Lebentritt
(74) *Attorney, Agent, or Firm* — Murphy, Bilak & Homiller, PLLC

(57) ABSTRACT

According to an embodiment, a solid-state bidirectional switch includes a first and a second power field-effect transistor electrically connected anti-serial with each other. Each of the first and second power field-effect transistors includes a source region, a drain region, a body region forming a pn-junction with the source region and having an inversion channel region, a gate terminal, a drift region between the body region and the drain region and having an accumulation channel region, and a drift control region adjacent to the accumulation channel region. The accumulation channel region is controllable through the drift control region. The solid-state bidirectional switch further includes a controller connected with the gate terminals of the first and second power field-effect transistors.

27 Claims, 9 Drawing Sheets

(56) References Cited

U.S. PATENT DOCUMENTS

| | | | |
|---|---|---|---|
| 2010/0134141 A1* | 6/2010 | Bertin et al. | 326/39 |
| 2010/0273307 A1 | 10/2010 | Sedlmaier et al. | |
| 2010/0301408 A1 | 12/2010 | Werner | |
| 2011/0260217 A1* | 10/2011 | Okamoto et al. | 257/194 |
| 2012/0018798 A1 | 1/2012 | Mauder et al. | |
| 2014/0054682 A1* | 2/2014 | Padmanabhan et al. | 257/330 |

FOREIGN PATENT DOCUMENTS

| | | |
|---|---|---|
| DE | 102006037510 B3 | 4/2008 |
| EP | 1814225 B1 | 9/2009 |
| EP | 2267785 A2 | 12/2010 |
| EP | 1908119 B1 | 4/2012 |
| WO | 2007012490 A2 | 2/2007 |

* cited by examiner

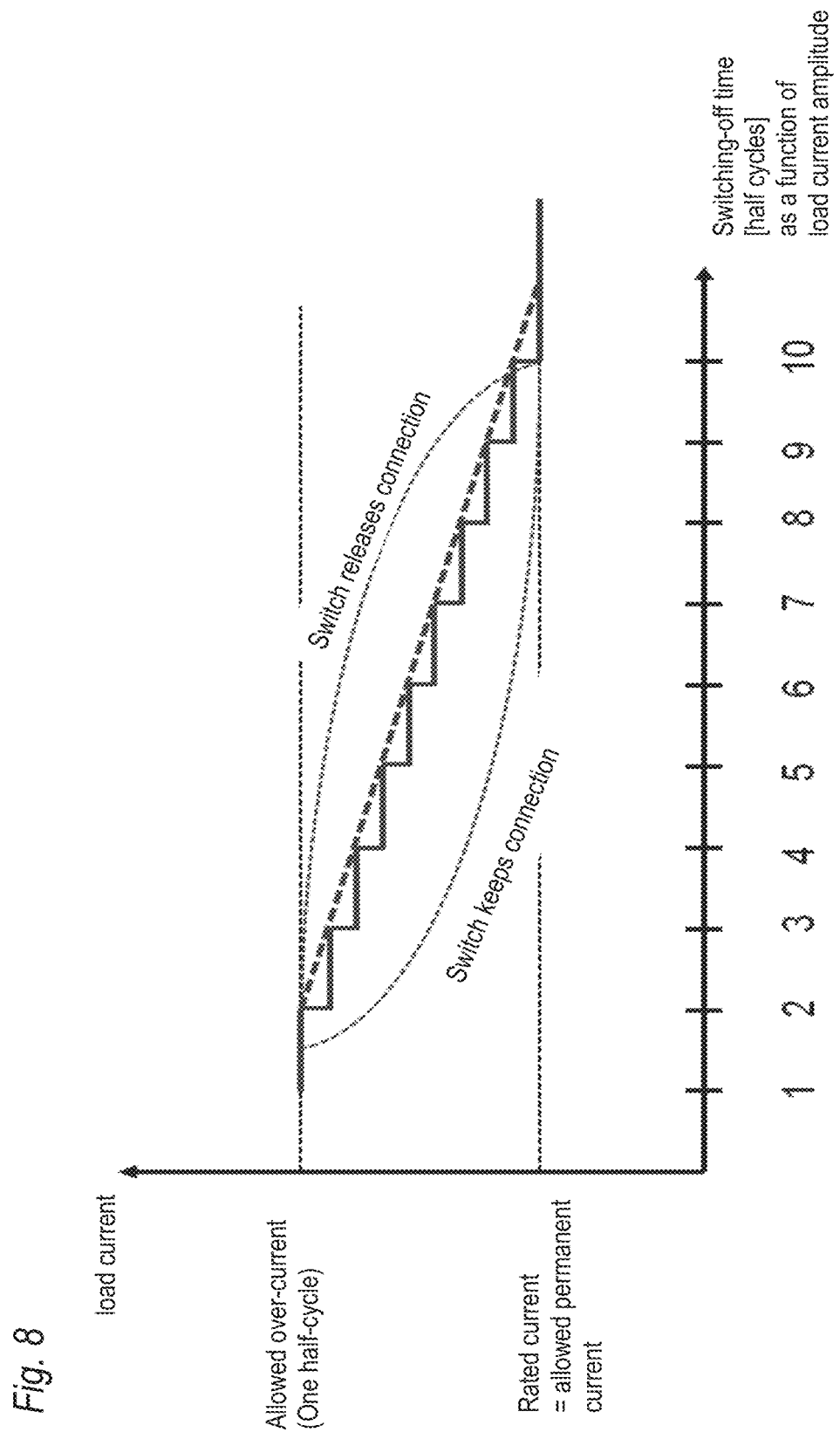

Fig. 11A
Fig. 11B
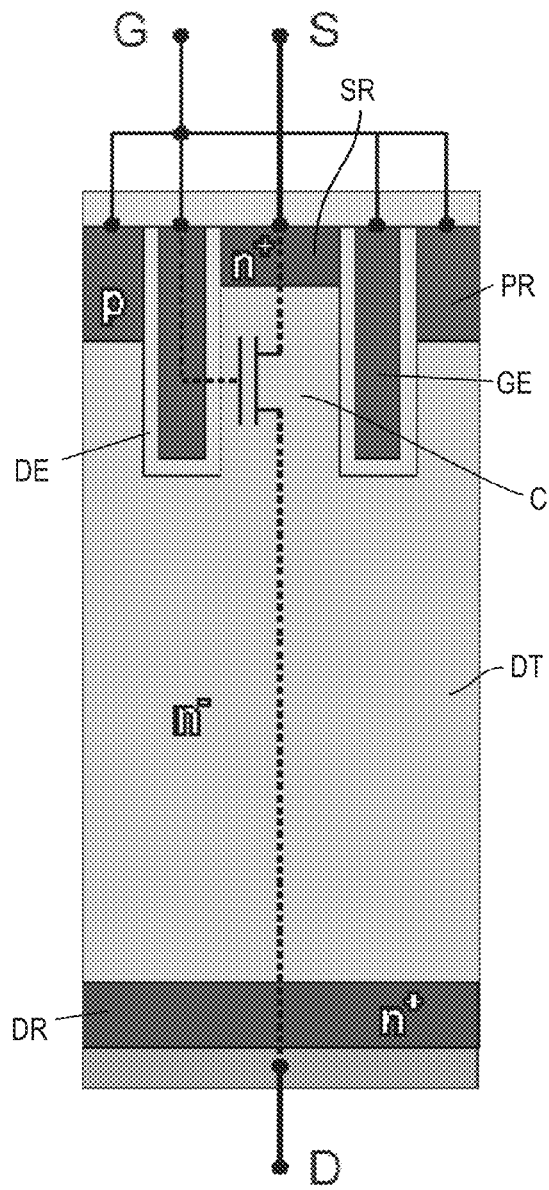
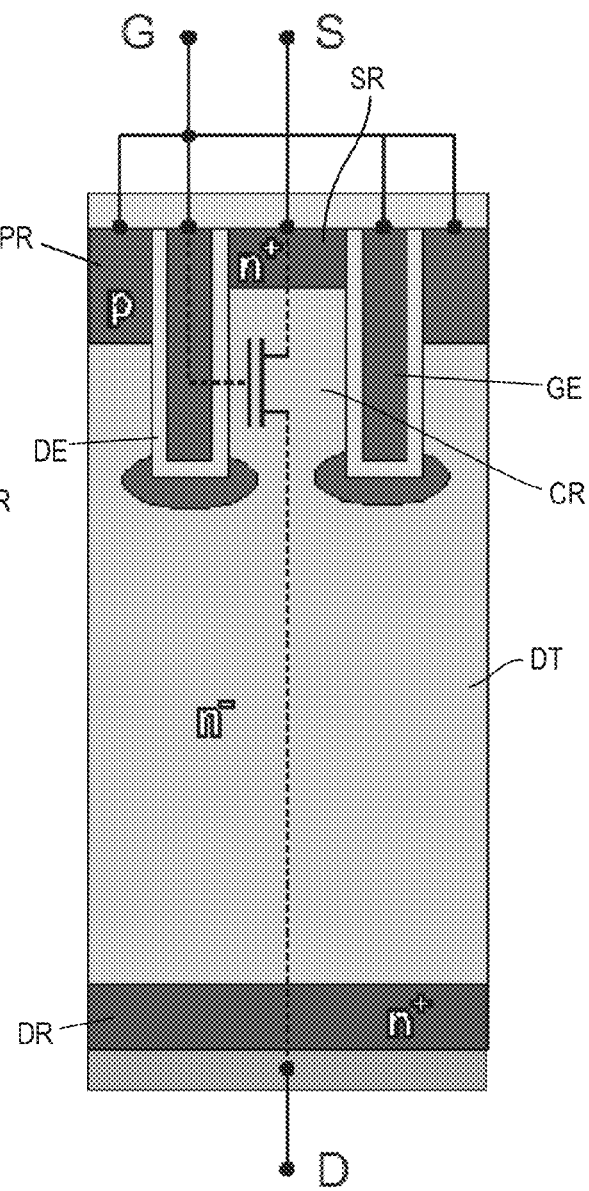

US 8,933,533 B2

SOLID-STATE BIDIRECTIONAL SWITCH HAVING A FIRST AND A SECOND POWER-FET

TECHNICAL FIELD

Embodiments described herein relate to solid-states bidirectional switches having a first and a second power-FET.

BACKGROUND

Demands for controlling loads in electrical grids such as local grids are getting higher due to increased use of renewable energy suppliers with varying supply of energy. The varying energy supplied to the end users may prompt a selective switching-on and off of loads to keep the balance between supply and load. The loads can be controlled through so-called smart meters which receive information from the network provider or through a bus system used for building automations.

Conventionally, mechanical switches having relays or electronic switches having bipolar devices such as thyristors or TRIACs have been used. Mechanical switches generate noise when operating and are therefore not suitable as in-wall power sockets. They are typically located in central distribution boxes or switch cases. This reduces the flexibility for using bus-systems to control home appliances and increases the complexity of the wiring. Furthermore, mechanical switches have a limited total cycle of operation, are prone to vibrations, may influence other components when operated, and have a limited switching frequency.

Electronic switches using bipolar devices inherently exhibit power losses due the pn-junction having a voltage drop of about 0.7 V. The power losses associated with this inherent voltage drop require means for thermal dissipation which make such electronic switches unsuitable for in-wall sockets or for switches integrated into small spaces with restricted thermal dissipation.

Electronic switches employing high-voltage MOS-FETs might be an alternative since FETs have an ohmic current-voltage characteristic and have a low on-state resistance. However, conventional MOS-FETs or FETs using compensation structures requires large chip areas for carrying rated currents of 16 A which is a typical value for domestic installations. For example, each FET would need an active chip area of about 250 mm² for a rated current of 16 A, an on-state resistance of 8 mΩ, and a rated blocking voltage of 650 V. Such devices would be too large for integrating on mounting rails or into an in-wall socket. The high rated blocking voltage of 650 V is needed since such high transients may occur in a phase of a 230 V network.

In addition to that, semiconductor switches are prone to over-currents and over-voltages, which might be caused by lightning strikes. Although measures are typically provided for discharging the over-currents and voltages, such measures may not be completely implemented leaving sections of TN-networks unprotected. Even when protected by residual-current circuit breaker (RCCB), which disconnects appliances when a fault current or a residual current occurs, the switches must be able to handle over-voltages and must carry the cut-off current according to the cut-off characteristic of the RCCB. In the event that the switch employing FETs is partially destructed due to a high cut-off current of an RCCB, the switch may be transferred into undefined conditions with large on-state resistances leading to increased thermal losses and therefore high risk of fire.

In view of the above, there is a need for improvement.

SUMMARY

According to an embodiment, a solid-state bidirectional switch having a first and a second power field-effect transistor electrically connected anti-serial with each other is provided. Each of the first and second power field-effect transistors includes a source region; a drain region; a body region forming a pn-junction with the source region and having an inversion channel region; a gate terminal; a drift region between the body region and the drain region and having an accumulation channel region; a drift control region adjacent to the accumulation channel region, wherein the accumulation channel region is controllable through the drift control region. The solid-state bidirectional switch further includes a controller connected with the gate terminals of the first and second power field-effect transistors.

According to an embodiment, a solid-state bidirectional switch includes a first and a second power field-effect transistor each having a source terminal, a gate terminal, and a drain terminal, wherein the source terminals of the first and second power field-effect transistors are electrically connected with each other to form a common source node. The solid-state bidirectional switch further includes a controller having at least one output terminal electrically connected with the gate terminals of the first and second power field-effect transistor, a reference terminal electrically connected with the common source node, and a first and a second input terminal. The solid-state bidirectional switch further includes a first non-linear voltage limiting element connecting the drain terminal of the first power field-effect transistor with the first input terminal of the controller; and a second non-linear voltage limiting element connecting the drain terminal of the second power field-effect transistor with the second input terminal of the controller.

According to an embodiment, a solid-state bidirectional switch includes a first and a second power field-effect transistor each having a source terminal, a gate terminal, and a drain terminal, wherein the drain terminals of the first and second power field-effect transistors are electrically connected with each other to form a common drain node. The solid-state bidirectional switch further includes a controller having a reference terminal electrically connected with the common drain node and at least one output terminal; a first level-shifter connecting the at least one output terminal of the controller with the gate terminal of the first power field-effect transistor; and a second level-shifter connecting the at least one output terminal of the controller with the gate terminal of the second power field-effect transistor.

According to an embodiment, a solid-state bidirectional switch includes a common lead frame comprising a metal layer; a first and a second power field-effect transistor each having a source metallization, a gate metallization, and a drain metallization, wherein the drain metallizations of the first and second power field-effect transistors are in contact with the metal layer of the common lead frame; a controller comprising at least one reference terminal electrically connected with the metal layer of the common lead frame, and an output terminal insulated from the metal layer of the common lead frame for controlling the first and second power field-effect transistor.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 8 illustrates the switching characteristic of a bidirectional switch according to an embodiment;

FIGS. 11A and 11B illustrate embodiments of non-linear voltage limiting element according to embodiments;

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

In this specification, the term "anti-serial" intends to describe an electrical connection between two transistors in one of the following configuration: either the sources of the transistors are electrically connected with each other to have a common source node or the drains of the transistors are electrically connected to have a common drain node.

The terms "electrical connection" and "electrically connected" describes an ohmic connection between two elements.

According to embodiments described herein, the solid-state bidirectional switch is capable of switching and controlling AC voltages and currents. The bidirectional switch therefore has an ohmic characteristic for both positive and negative voltages.

According to embodiments described herein, the controller can be a low voltage bipolar and/or CMOS device operating at voltages lower than the voltages switched by the solid-state bidirectional switch.

Figure 1:
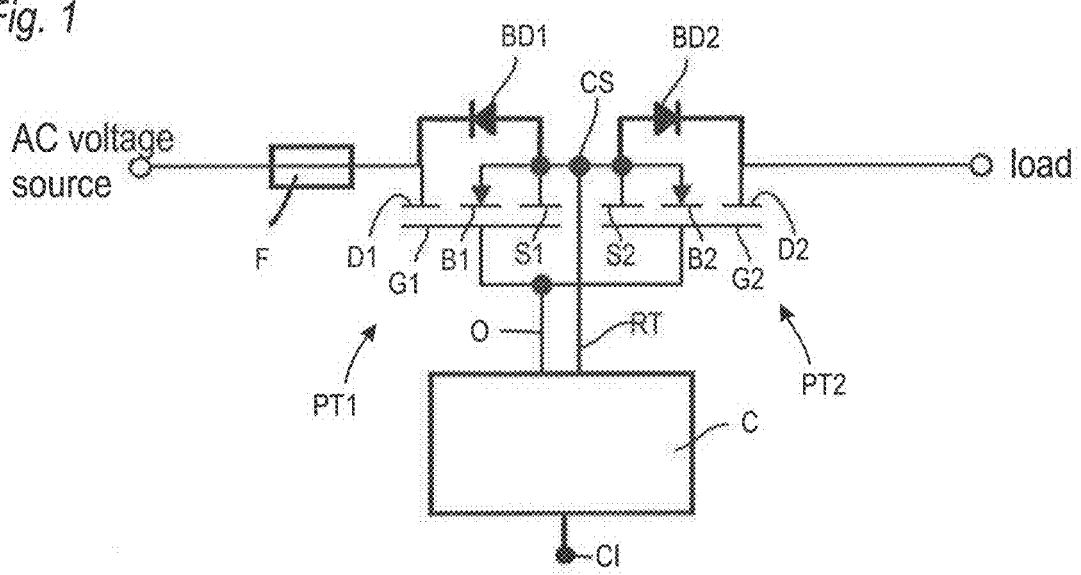
FIG. 1 illustrates a solid-state bidirectional switch having two power-MOSFETs with common source node according to an embodiment.

With reference to FIG. 1, a first embodiment of a solid-state bidirectional switch is described. The solid-state bidirectional switch, which can also be described as solid-state AC switch, includes a first and a second power field-effect transistor PT1, PT2 which are electrically connected anti-serially with each other. In the following, the power field-effect transistors are referred to as power-FETs. In the present embodiment, the power-FETs PT1, PT2 are in a source-to-source connection to have a common source node CS. Each of the first and second power-FETs PT1, PT2 includes a source region S1, S2, a drain region D1, D2, a body region B1, B2 forming a pn-junction with the source region S1, S2 and having an inversion channel region, and a gate electrode G1, G2 adjacent to the inversion channel region of the body region B1, B2. The gate electrode G1, G2 can be arranged in respective trenches. The inversion channel regions of the power-FETs PT1, PT2 are controllable through the respective gate electrode G1, G2. Each power-FET PT1, PT2 further includes a drift region between the body region B1, B2 and the drain region D1, D2. The solid-state bidirectional switch further includes a controller C connected with the gates G1, G2 of the electrodes of the first and second power-FETs PT1, PT2.

The drift region can include, according to an embodiment, an accumulation channel region and a drift control region arranged adjacent to the accumulation channel region to control the accumulation channel region. The inversion channel region and the accumulation channel region of each of the power-FETs PT1, PT2 are typically vertical channels with respect to a first surface of a semiconductor chip.

According to an embodiment, the power-FETs PT1, PT2 do not have a separate gate electrode and gate dielectric. The function of the gate electrode and gate dielectric is provided by the drift control region, specifically a portion of the drift control region adjacent to the body region. The inversion channel region is therefore arranged next to, and controlled by, the drift control region. For example, the drift control region can vertically extend through the active part of device, i.e. can extend from a source region to a drain region. In an upper region adjacent to the body region, the drift control region functions as gate electrode to control the inversion channel region. In a lower region below the upper region, the drift control region controls the accumulation channel region.

Hence, only one terminal is needed. The accumulation channel region and inversion channel region can extend along the same vertical line and are controlled by action of an electric field of drift control region.

In other embodiments, the gate electrode and drift control region are different and spaced apart from each other wherein the gate electrode controls the inversion channel region and the drift control region controls the accumulation channel region. Both can be independently controlled. In any case, the inversion channel region and accumulation channel region are controlled through action of an electric field.

Each of the power-FETs PT1 and PT2 includes a so-called body diode BD1 and BD2, respectively, which is formed by a pn-junction between the respective drift region and the body region of the power-FETs PT1, PT2. Due to the intrinsic body diode, a FET can block a current only in one direction but not in both directions. Therefore, two power-FETs PT1, PT2 in anti-serial connection are used so that, regardless of the direction of the current, the switching device can reliably block the current. This allows switching of AC voltage sources such as the AC voltage of grids.

Hence, a bidirectional semiconductor switch capable of switching alternating voltages and currents and having at least two power-FETs in anti-serial connection with a common node is provided. Each of the power-FETs has a vertical inversion channel controllable by a gate electrode and a vertical accumulation channel controllable by a drift control region. The bidirectional semiconductor switch further includes a controller for providing a common control signal to control the least two power FETs.

The controllable vertical accumulation channel reduces the on-state resistance of the power-FETs and thus allows to reduce thermal losses and to use smaller devices.

As shown in FIG. 1, the common source node CS of the power-FETs PT1 and PT2 is electrically connected with a reference terminal RT of the controller C. Output O of the controller C is electrically connected with the gates G1 and G2 of the power-FETs PT1 and PT2. The drain D1 of the first power-FET PT1 is electrically connected with an AC voltage source while the drain D2 of the second power-FET PT2 is electrically connected with a load. It would also be possible to connect drain D1 with the load and drain D2 with the AC voltage source.

The bidirectional switch may further include a fuse F as indicated in FIG. 1.

Figure 9A:
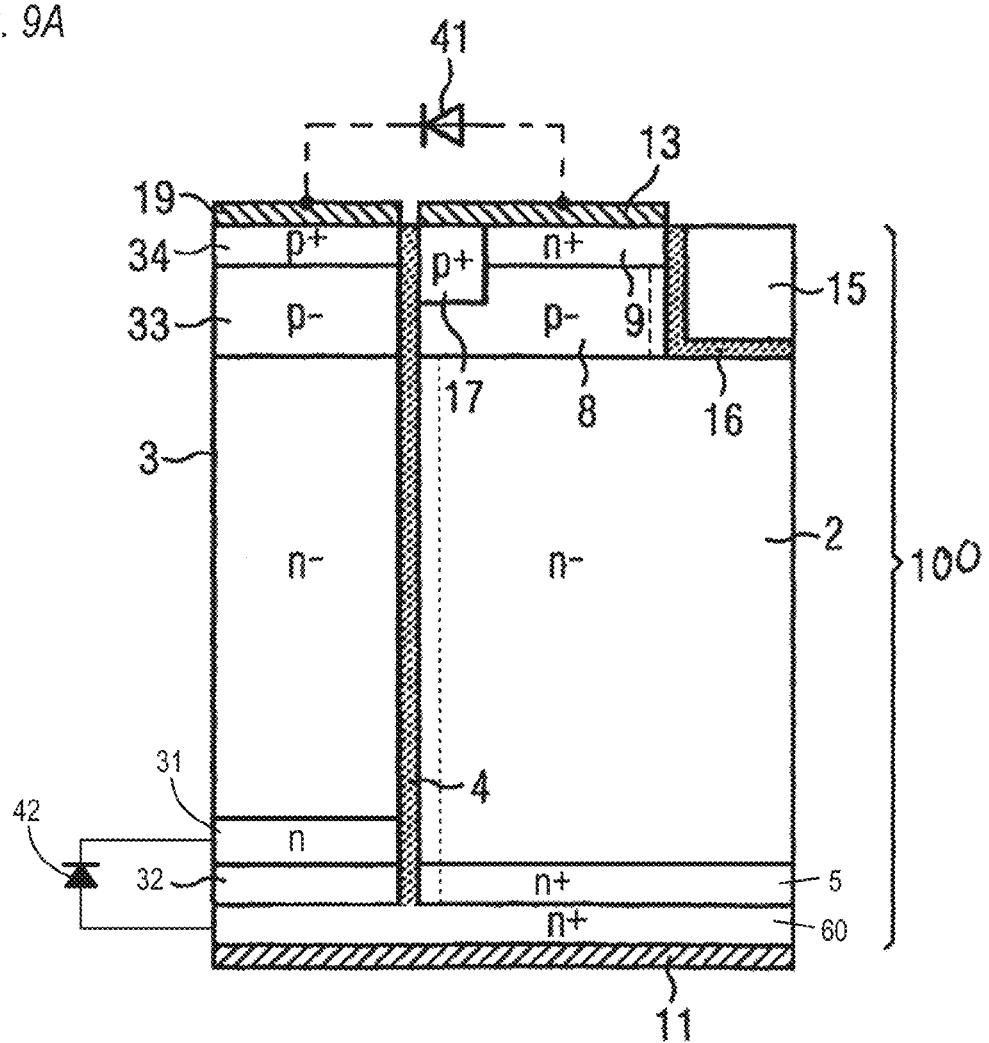
FIG. 9A illustrates a power-MOSFET embodied as TEDFET as used in one or more of the embodiments described herein.

An example of a power-FET suitable for employing in the bidirectional switch is illustrated in FIG. 9A. The power-FET has a semiconductor body 100, a semiconductor drift region 2 in the semiconductor body 100, and a drift control region 3 made of semiconductor material which is arranged, at least in sections, adjacent to the drift region 2 in the semiconductor body 100. The drift control region 3 can be of a first conductivity type, of a second conductivity type complementary to the first conductivity type, or can be intrinsic. The drift region 2 can be of the first conductivity type. An accumulation dielectric 4 is arranged between the drift region 2 and the drift control region 3. A body region 8 of the second conductivity type and a drain region 5, 60 of the first conductivity type are arranged at a distance from each other with the drift region 2 being arranged between the drain region 5, 60 and the body region 8. A source region 9 of the first conduction type is separated from the drift region 2 by the body region 8. A gate electrode 15 is insulated from the semiconductor body 100 by means of a gate dielectric 16 and extends adjacent to the body region 8 from the source region 9 as far as the drift region 2. The gate electrode 15 is arranged in a trench lined by the gate dielectric 16. In the present embodiment, 'first conductivity type' refers to n-doped while 'second conductivity type' refers to p-doped. Opposite doping relations can also be used and the present invention is not limited to the specific doping relation as described herein.

P-doped body region 8 includes a vertical inversion channel region which is formed along gate dielectric 16 when a positive voltage exceeding a given threshold voltage is applied to gate electrode 15. The inversion channel region is indicated in FIG. 9A by a vertical dashed line close to the gate dielectric 16. The inversion channel region electrically connects the source region 9 with the drift region 2 and is controllable through the gate electrode 15.

N-doped drift region 2 includes a vertical accumulation channel region which is formed in the drift region 2 along the accumulation dielectric 4 when a positive voltage exceeding a given threshold voltage is applied to the drift control region 3. The vertical accumulation channel region is indicated in FIG. 9A by a dotted line along the accumulation dielectric 4. The accumulation channel region, when formed, provides a low ohmic path which reduces the on-state resistance Ron of the power-FET. Due to the capability of having a controllable accumulation channel region, the thermal power losses of the power-FET can be reduced. Furthermore, the doping concentration of the drift region 2 can be reduced which improves the blocking characteristics of the power-FET.

A highly p-doped body contact 17 provides an electrical connection between the body region 8 and a source metallization 13.

For operating the power-FET, an optional first rectifier element 41 can be provided via which the drift control region 3 is coupled to the source region 9. A doped connection region 33, 34 of the second conduction type can be provided via which the drift control region 3 is coupled to the source region 9. The connection region 33, 34 has a connection electrode 19. The first rectifier element 41 is connected between the connection electrode 19 and the source region 9 through the source metallization 13.

According to an embodiment, the gate electrode 15 and drift control region 3 are supplied with the same electrical potential during operation to ensure low on-state losses as described above.

A connection region 31 of the first conduction type is adjacent to the drift control region 3 and doped more highly than the drift control region 3. The drift control region 3 is coupled to the drain region 5, 60 via a connection zone 31, and a second rectifier element 42 between the connection zone 31 and a drain metallization 11. According to an embodiment, the second rectifier element 42 can be buried in the semiconductor body 100. According to another embodiment, the second rectifier element 42 can be realized as a planar element close to the first or second surface of the semiconductor body 100. The second rectifier element 42 allows thermally generated electrons to flow to the drain region 5, 60. A dielectric region 32 electrically insulates the connection region 31 and the drift control region 3 from the drain region 5, 60. The drain region 5, 60 can be comprised of two regions, as shown in FIG. 9A, or as a single region, for example by omitting region 5, as shown in FIG. 9B.

The power-FET as illustrated in FIG. 9A is referred to as TEDFET (Trench-Extended Drain Region-FET) as described in WO 2007/012490 A1 (EP 1 908 119 B1), US 2010/0301408 A1 (U.S. Pat. No. 7,999,311 B2), US 2008/0067626 A1, US 2007/0108513 A1 (U.S. Pat. No. 7,459,365 B2) and US 2010/0273307 A1, the disclosures of which are incorporated herein by reference in their entirety.

The power-FETs which can be used for the solid-state bidirectional switch as described herein are not limited to the specific structure as illustrated in FIG. 9A. For example, TEDFETs and EGFETs (Extended Gate FET) are particularly suitable since both have a lower area-specific on-state resistance Ron than other FETs such as FETs having compensation structures (so-called CoolMOS). EGFETs are, for example, described in WO 2007/012490 A1 and EP 1 908 119 B1, the disclosure of which are incorporated herein by reference in their entirety.

Figure 9B:
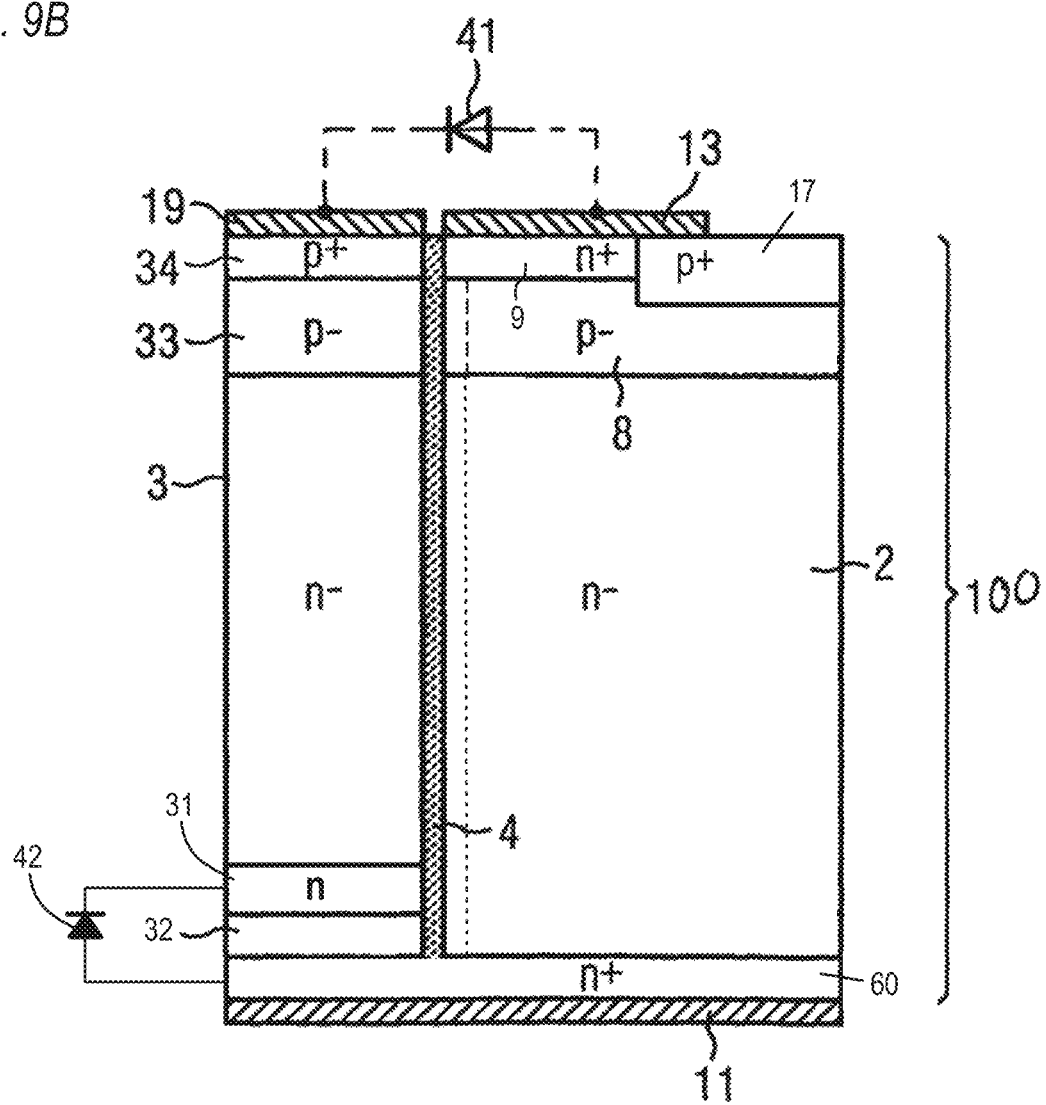
FIG. 9B illustrates a power-MOSFET embodied as EGFET as used in one or more of the embodiments described herein.

One example for the structure of an EGFET is illustrated in FIG. 9B. The EGFET does not include a gate dielectric and a gate electrode 15. Different to FIG. 9A, highly p-doped body contact 17 is arranged spaced apart from the accumulation dielectric 4. Adjacent to the accumulation dielectric 4, an n+ source region 9 is located. When connecting the drift control region 3 directly with the external gate terminal an inversion channel in the body region 8 can be formed. Below the body region 8 the electron channel—now as an accumulation channel—along the accumulation dielectric 4 is leading to a low resistive connection from the source region 9 to the drain region 60. The accumulation dielectric 4 functions here as a gate dielectric insulating the drift control region 3 from the body region 8.

For example, a typical area-specific resistance (Ron·A, with A the area) of an EGFET having a rated blocking voltage of 650 V can be lower than 0.3 $\Omega mm^2$. In addition to that, it is assumed that the potential to shrink the feature size of the EDFETs and TEDFETs is higher than for other devices and therefore even lower values for an area-specific resistance may be reached. The losses generated by a conventional circuit breaker for 16 A rated current with an on-state resistance of 8 m$\Omega$ can serve as reference for the electronic switch. Based on the above values, two power-FETs each having an active area of 72 $mm^2$ would be needed for a rated current of 16 A which is much less than for comparable conventional MOS-FETs.

The low area-specific on-state resistance, which reduces power losses of the power-FETs, allows the power-FETs to be provided in packages suitable for integrating in household appliances and in-wall installations. For example, packages such as chip-embeddings, where the chips are embedded in a mould, are possible. Such types of packages also allow integration of multiple chips and/or fuses which can be embodied by a wire or other fusible electrical connection. Such type of fuses provides a reliable protection against fire in case of electrical overloading.

The typical voltage of a grid to be switched does not have a high frequency. Typical frequencies are 50 to 60 Hz. According to an embodiment, the power-FETs are switched-on during zero voltage crossing of the AC voltage and switched-off during zero current crossing of the AC current. When a respective switching signal is provided at the control input CI of the controller C, the controller detects the respective zero-crossing and switches the power-FETs. Switching at zero crossings reduces unwanted feedback of the load to the AC voltage source as known from switches employing relays.

In the embodiment illustrated in FIG. 1, the reference terminal RT of the controller C is connected with the common source node CS. The controller C is typically embodied as a low-voltage CMOS device having electronics to control the power-FETs PT1 and PT2. In order to detect zero-crossings, for example of the AC voltage of up to 380 V, a protection structure is used to protect the low voltage inputs of the controller C. Such structures are described in connection with FIG. 2.

Figure 2:
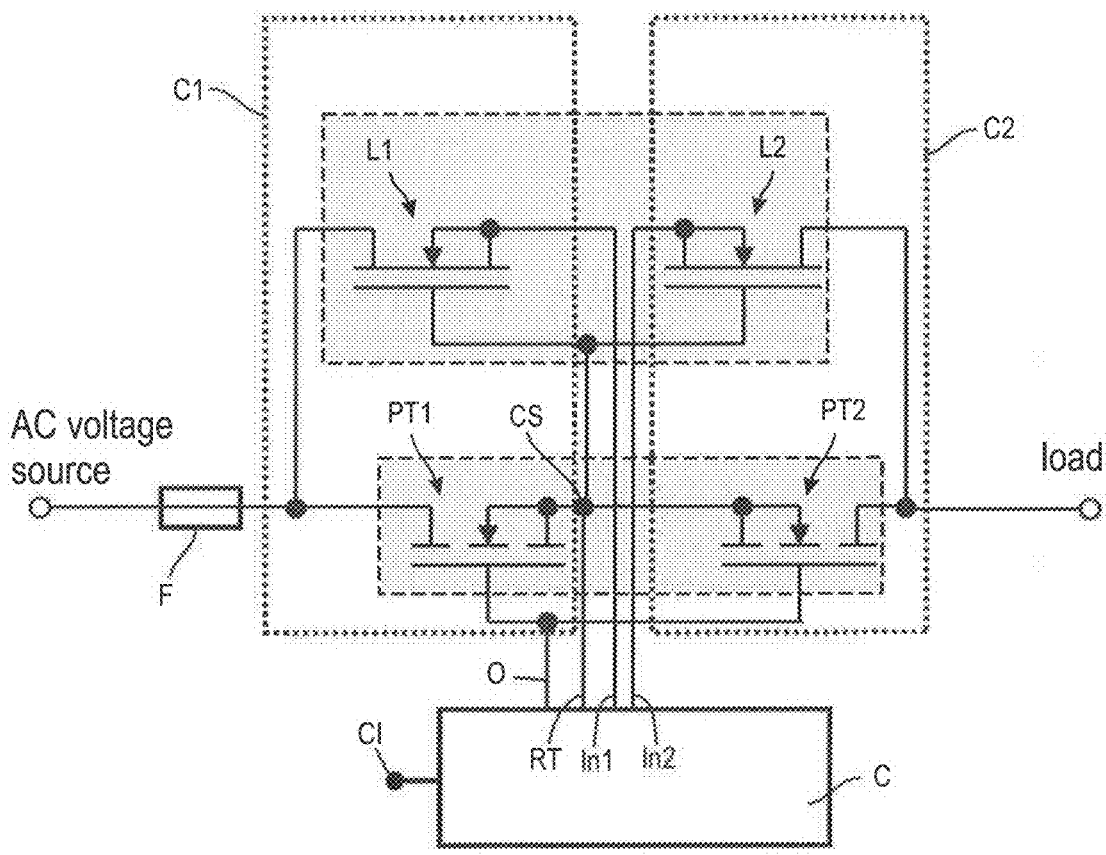
FIG. 2 illustrates a solid-state bidirectional switch having two power-MOSFETs with common source node and non-linear voltage limiting elements according to an embodiment.

The bidirectional switch of FIG. 2 includes, in addition to the bidirectional switch of FIG. 1, two voltage-limiting devices L1 and L2. According to an embodiment, the voltage-limiting devices L1 and L2 are non-linear voltage-limiting elements. Each of the non-linear voltage limiting devices L1 and L2, which are referred to hereinafter as limiters, includes an input terminal embodied here as a drain, a control terminal embodied here as a gate, and an output terminal embodied here as a source. The input terminal or drain of the first limiter L1 is electrically connected with the drain D1 of the first power-FET PT1. The input terminal or drain of the second limiter L2 is electrically connected with the drain D2 of the second power-FET PT2. The control terminals or gates of the first and second limiters L1 and L2 are electrically connected with the common source node CS. The output terminal or source of the first limiter L1 is electrically connected to a first input In1 of the controller C while the output terminal or the source of the second limiter L2 is electrically connected to a second input In2 of the controller C.

The limiters L1 and L2 are configured to limit an input voltage, which is supplied to the input terminal, to a maximum output voltage, which is presented at the output terminal, depending on a control voltage supplied to the control terminal. Hence, a voltage supplied to the drains of the limiters L1 and L2 are limited to a maximum voltage defined by the voltage supplied to the gate of the limiters L1 and L2.

The controller C "floats" with the voltage presented at the common source node CS and thus provides an output voltage presented at output O relative to the voltage of the common source node CS. This ensures that the power-FETs PT1 and PT2 are reliably either in the on-state or the off-state. On the other hand, the voltage provided by the AC voltage source significantly varies relative to the voltage presented at common source node CS when the power-FETs PT1 and PT2 are in the off-state. In order to detect a zero voltage crossing of the AC voltage source, the AC voltage supplied by the AC voltage needs to be detected by the controller C. Directly connecting the controller C with the AC voltage source would, however, destroy the controller C which employs low-voltage CMOS elements. Limiters L1 and L2 connected between the drains D1 and D2 of the power-FETs PT1 and PT2, to which the AC voltage is supplied, and the respective inputs In1 and In2 of the controller C thus limits the voltage delivered to the controller C and protects the inputs of the controller C against high voltages.

According to an embodiment, the limiters L1 and L2 can be embodied as described in U.S. Serial application Ser. No. 12/868,918 and U.S. Serial application Ser. No. 13/429,579, the disclosures of which are incorporated herein by reference in their entirety. Exemplary embodiments of suitable limiters are illustrated in FIGS. 11A, 11B, 12 and 13 which will be briefly described hereinafter.

A source region SR, a drain region DR and gate electrode GE of a limiter are illustrated in FIGS. 11A and 11B. The source region SR and drain region DR are both heavily n-doped with a weakly n-doped drift region DT between the source region SR and drain region DR. A gate electrode structure with the gate electrode GE formed in trenches laterally confines a channel region CR of the drift region DT below the source region SR. The gate electrode GE is electrically insulated by a dielectric DE from the channel region CR. A gate terminal G connected to the gate electrode GE, a source terminal S connected to the source region SR, and a drain terminal D connected to the drain region DR are also shown.

The limiter is a normally-on device since there is an electrical connection between the source region SR and drain region DR through the drift region DT. A voltage supplied to the drain region DR appears at the source region SR minus a small voltage drop caused by the inherent resistance of the drift region DT. Hence, the voltage appearing at the source region SR follows the voltages applied to the drain region DR. The situation changes when a negative voltage relative to the drain region DR is applied to the gate electrodes GE through the gate terminal G. The negative voltage of the gate electrodes GE causes the channel region CR to deplete. The channel region CR is completely depleted when the voltage difference between the gate electrode GE and the drain region DR exceed a given pinch-off voltage. The pinch-off voltage can be defined by selecting the distance between the gate electrodes GE, to be more precise the lateral width of the channel region CR between the gate electrodes GE, and the doping concentration of the channel region CR. Hence, the voltage appearing at the source region SR is the sum of the voltage supplied to the gate electrode GE and the pinch-off voltage. The voltage appearing at the source region SR can therefore be varied, during operation, by supplying a given voltage to the gate electrode GE.

When the channel region CR is completely depleted so that no conductive path is provided any more between the source region SR and drain region DR, the voltage appearing at the source region S is now "clamped" and remains constant regardless of any further increase of the voltage supplied to the drain region DR. Therefore, the voltage appearing at the source region SR is "limited" to a voltage corresponding to the voltage of the gate electrode GE plus the pinch-off voltage.

FIGS. 11A and 11B furthermore illustrates a p-doped region PR which is used to collect thermally generated holes. FIG. 11B also shows an embodiment with p-doped regions around the bottom of the trenches which also influences the pinch-off voltage.

Figure 12:
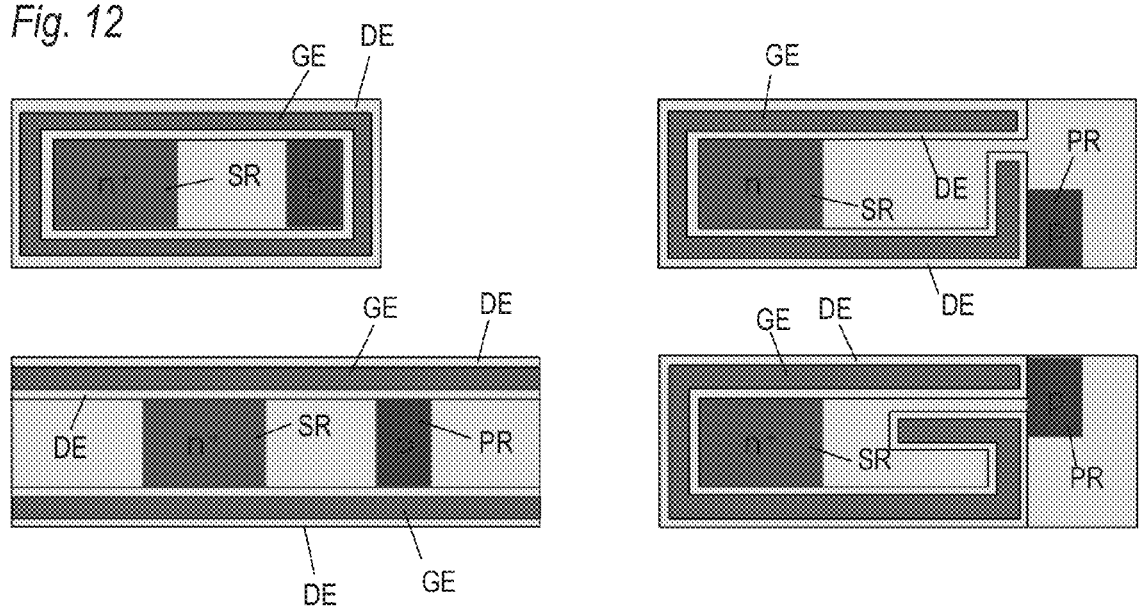
FIG. 12 illustrates various layouts of non-linear voltage limiting elements according to embodiments.

FIG. 12 show various embodiments of the layout of the gate electrode structure and the arrangement of the source region SR and the p-doped region PR.

Figure 13:
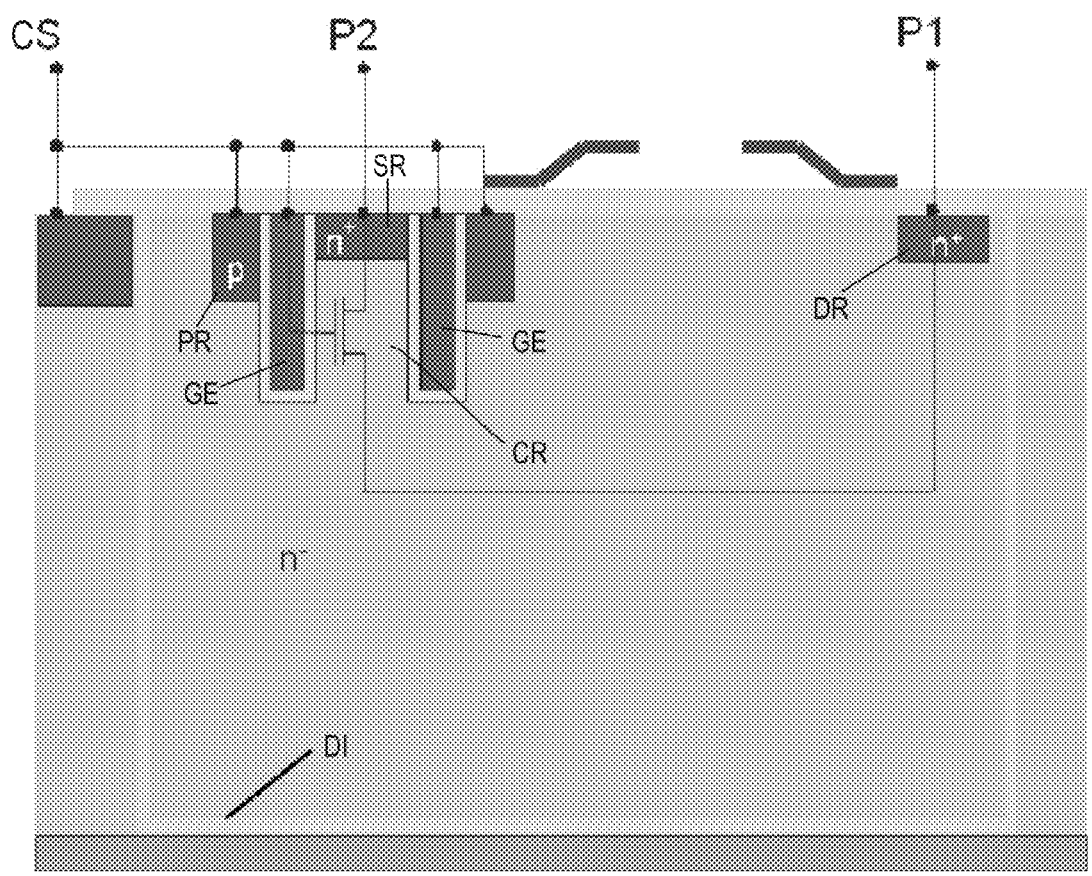
FIG. 13 illustrate a further embodiment of non-linear voltage limiting element according to an embodiment.

FIG. 13 illustrates a further embodiment of a limiter structure which is integrated into a semiconductor chip having also integrated a power-FET. The common source node CS of the power-FET is illustrated to the left and is electrically connected with the gate electrodes GE of the limiter. Different to the embodiments of FIGS. 11A and 11B, the connection to the drain region DR is also at a top surface of the semiconductor chip. Since the semiconductor chip at its lateral limits is on drain potential, the drain voltage may be tapped either on the top surface or at the drain metallization at the backside of the chip. Furthermore, the limiter is electrically insulated against the rest of the semiconductor chip by a dielectric insulation DI.

Similar to the embodiments illustrated in FIGS. 11A and 11B, the voltage appearing at P2 (corresponding to the source region of the limiter) is limited to the voltage supplied to the common source node CS and thus the gate electrode GE plus the pinch-off voltage of the limiter. Therefore, when the voltage difference between the common source node CS and terminal P2 exceeds the pinch-off voltage, a further rise of the voltage supplied to terminal P2 does not cause a further increase of the voltage appearing at terminal P1. The limiter therefore limits the voltages supplied to the first and second input terminals In1 and In2 of the controller C and thus protects the controller C against high voltages.

On the other hand, when the AC voltage is close to zero, the limiters do not limit the voltage so that the AC voltage is applied to inputs of the controller C. In other words, the sinusoidal voltage course of the AC voltage is truncated for voltage exceeding the voltage at common source plus the pinch-off voltage of the limiters. The controller C can therefore reliably detect the zero-voltage crossing of the AC voltage.

The limiter structures as illustrated in FIGS. 11A, 11B, 12 and 13 can be integrated into the same semiconductor chip as used for integration the respective power-FETs. A lateral insulation can be provided, for example, as illustrated in FIG. 13. The bidirectional switch can include a first chip C1 with the first limiter L1 and the first power-FET PT1 integrated therein, and a second chip C2 with the second limiter L2 and the second power-FET PT2 integrated therein as illustrated in FIG. 2.

The limiters L1 and L2 limit the voltage to a fixed value above a reference potential defined by the common source CS, which is connected with the gate electrodes of the limiters, by pinching-off of the channel region CR. The drain regions of the limiters L1 and L2 are either at drain potential of the power-FETs PT1 and PT2 or at a potential close to the drain potential.

The zero current crossing can be determined in a known manner. The voltage supplied by the limiters L1 and L2 can also be used for estimating the current flowing through the power-FETs PT1 and PT2. In this state the power-FETs PT1 and PT2 are in the on-state and that therefore no high voltage differences between the common source CS and drain of the power-FETs are present.

Switching of the power-FETs PT1 and PT2 is controlled through the controller C which receives a respective control signal at control input CI. Depending on whether the power-FETs PT1 and PT2 shall be switched-on or switched-off, either the zero voltage crossing or the zero current crossing of the AC voltage source is determined. Switching-on takes place, according to an embodiment, during zero voltage crossing of the AC voltage source to reduce a capacitive feedback of the load. Switching-off takes place, according to an embodiment, during zero current crossing to reduce an inductive feedback of the load.

When in the off-state, one of the power-FETs PT1 and PT2 is short-circuited due to the integrated body diode. The drain and source of the short-circuited power-FET are then at the electrical potential of the common source node CS so that the gate and drain of the corresponding limiter would also be at the electrical potential of the common source node CS. As a consequence, the limiter would deliver the voltage of the common source node CS to the controller C. In this case, the controller C would "detect" a zero-crossing at the respective input although no zero-crossing occurred. To avoid this, the controller C enables switching only when both inputs In1 and In2 detect a zero crossing.

Switching-off may actually occur at the first zero current crossing or after few zero current crossings to reduce the risk of thermal damage.

Returning to FIGS. 9A and 9B, the low switching frequencies, which will typically not exceed the frequency of the AC voltage, also allows that the drift control region 3 of the power-FET can be charged up to the maximum allowable voltage different to fast switching applications. As a consequence, the reduction of the on-state resistance Ron due to the generation of an accumulation channel is further enhanced.

A further benefit of the bidirectional switch as described herein is the possibility to integrate a residual-current circuit breaker (RCCB) which is sometimes also referred to as a ground fault circuit interrupter, or to embody the bidirectional switch as an RCCB. Commercially available RCCBs have rated residual currents I$\Delta$N of 10 mA, 30 mA, 100 mA, 300 mA, 500 mA and 1 A with the tolerance of the residual current (or differential current) by 50%. For personal security a maximum residual current of 10 mA or 30 mA is allowable, and for fire prevention a maximum residual current of 300 mA is allowable. The maximum allowable release time (time between occurrence of the residual current and the switching of the RCCB) is, according to DIN VDE 0100-410:2007, 400 ms in TN grids for single rated residual current. For a fivefold higher residual current the allowable release time is only 40 ms. When using the bidirectional switch as described herein, the release time can be limited to 10 ms only corresponding to the duration of a half-cycle, even for single rated residual current since switching-off can be effected at the next zero current crossing. The bidirectional switch also allows limiting the residual current unlike conventional RCCBs using a magnetic trigger. Security and protection of people and appliances can thus be increased.

Figure 3:
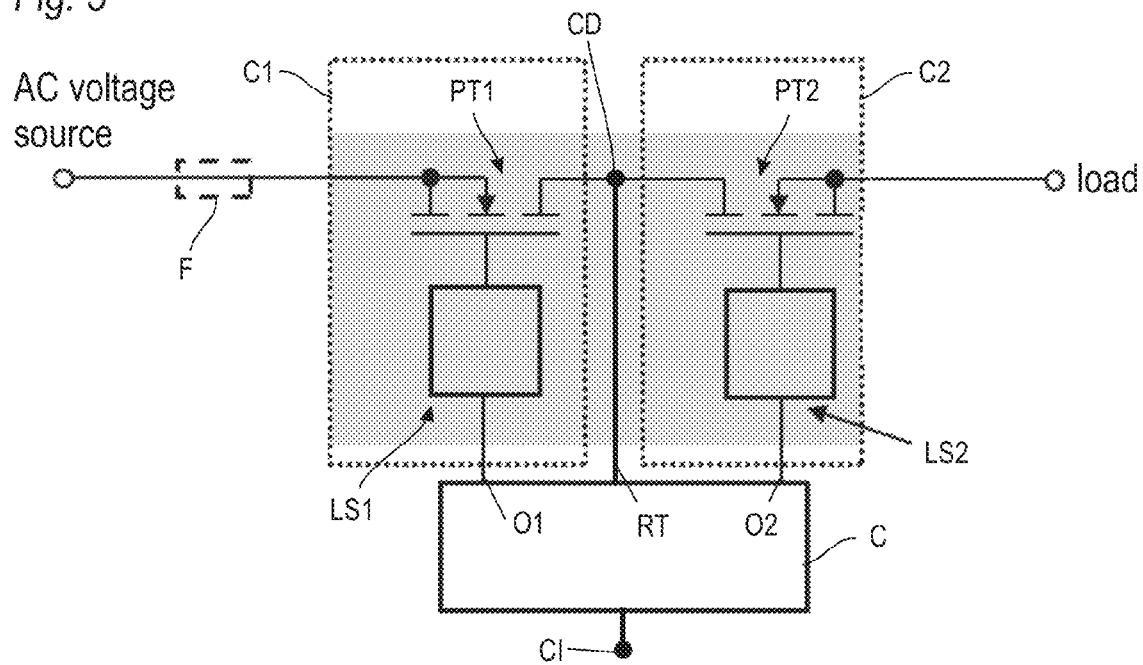
FIG. 3 illustrates a solid-state bidirectional switch having two power-MOSFETs with common drain node according to an embodiment.

FIG. 3 illustrates a further embodiment of the bidirectional switch employing power-FETs PT1 and PT2 in anti-serial connection with a common drain node CD, i.e. the drains of the power-FETs PT1 and PT2 are electrically connected with each other. The common drain node CD is connected with reference terminal RT of the controller C. The bidirectional switch of FIG. 3 includes a first and a second semiconductor chip C1, C2 each including a power-FET PT1 and PT2 integrated therein. Each semiconductor chip C1 and C2 further includes a level-shifter LS1, LS2 which electrically connects the respective gate of the power-FET PT1, PT2 with a first and a second output O1, O2 of the controller C, respectively. Since the controller C is operated relative to the common drain node CD, the level-shifters LS1 and LS2 are used to shift the voltages appearing at first and second outputs O1 and O2 to the voltages needed at the respective gates. The reason is that the gate voltages should be defined relative to the source and the voltage at source can significantly differ to the voltage at drain. Hence, when the controller C delivers a voltage of in a typical range of +3V to +25V, e.g. +10V relative to the drain, this voltage needs to be shifted to a voltage relative to the source. The controller C could also have common output to which the level-shifter LS1 and LS2 are connected.

The level-shifters LS1 and LS2 can also be monolithically integrated into the respective chips C1 and C2.

Figure 10:
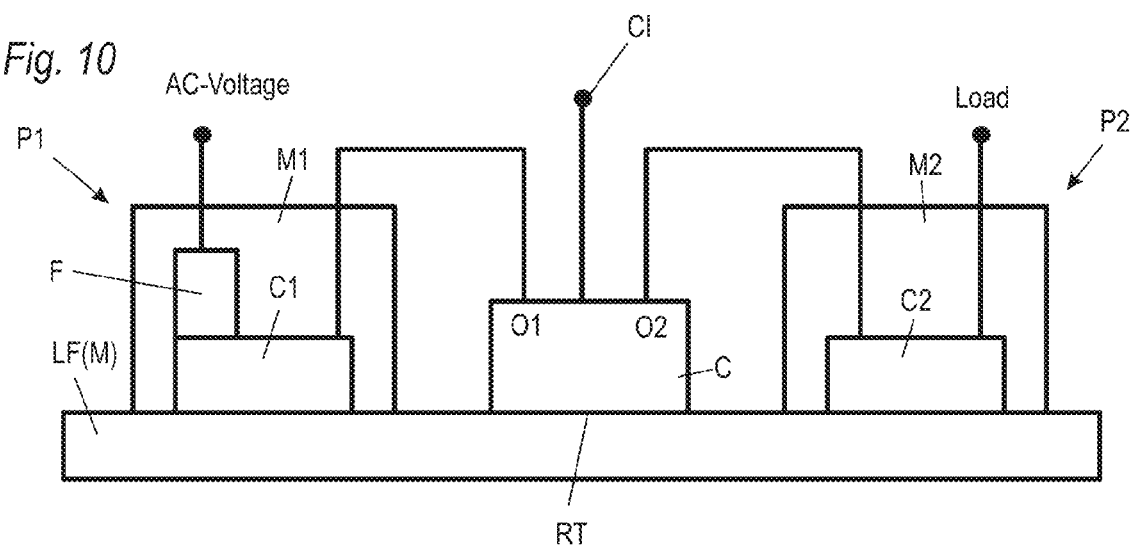
FIG. 10 illustrates a solid-state bidirectional switch with a common lead frame according to an embodiment.

The configuration as illustrated in FIG. 3 with the common drain node CD has the benefit that the two power-FETs and the controller C can be arranged on a common lead frame LF as illustrated in FIG. 10. The lead frame LF can include a metal layer M forming the lead frame LF. Two device packages P1 and P2 each having a chip C1 and C2 are provided and arranged on the common lead frame LF. Each chip C1 and C2 includes a power-FET and a level-shifter as described above. The drain metallization of the power-FETs are electrically connected to the lead frame LF so that also a thermal connection is provided. The controller C is also electrically connected with its reference terminal RT to the common lead frame LF. Outputs O1 and O2 are insulated from the lead frame LF and electrically connected with the gates of the respective power-FETs via the respective level-shifter.

As shown in FIG. 10, the power-FETs are provided in separate chips C1 and C2. The chips C1 and C2 are embedded in respective molding material M1 and M2. An optional fuse F can also be embedded into one or both of the device packages P1 and P2.

The common drain configuration conventionally requires two controllers since the gate voltages of the power-FETs needs to be controlled relative to source potentials of the power-FETS which source potentials can deviate from each other. According to an embodiment described herein, only one controller is needed when level-shifters are used to connect the controller with the gates. This reduces the number of components, increases the reliability of the switch and also allows improved heat dissipation due to the use of the common lead frame. The common lead frame LF also provides for a further shrink of the switch. Furthermore, for low power applications, the controller and/or the two power-FETs including the lever-shifters can be monolithically integrated into the same chip.

The level-shifters are described in more detail in connection with FIG. 5. The bidirectional switch includes two power-FETs PT1, PT2 connected anti-serial with each other in a drain-to-drain connection. The power-FETs PT1, PT2 are integrated into separate semiconductor chips (first and second chips) denoted with C1 and C2. In an alternative embodiment the power-FETs PT1 and PT2 can be integrated in a single chip since they share the same drain on the back surface of the chip. Each semiconductor chip C1, C2 may further include two non-linear voltage limiters (first limiters L11, L21, and second limiters L21, L22) and two normally-off FETs E1, E2 which form the respective level-shifters and which are monolithically integrated into the respective semiconductor chips C1 and C2. The controller C is at the high-side since the controller C is operated relative to the electrical potential at the common drain node CD. Similar to the bidirectional switches of FIGS. 1 and 2, the switch of FIG. 5 can be operated so that switching occurs at zero crossing. The controller C can also be integrated in the single chip, or can be provided separately.

Returning to FIG. 5, assume that the power-FETs are in an off-state. Assume furthermore a negative half-cycle so that a negative voltage is supplied to the source of power-FET PT1 and a positive voltage to the source of power-FET PT2. In this case, the second power-FET PT2 conducts due to the integrated body diode (not shown here) and the whole AC voltage drops over the first power-FET PT1 (neglecting the knee voltage of the body diode). The voltage at the source of the limiter L11 is at the pinch-off voltage of the limiter L11 and drops over resistor R. The source of limiter L11 is connected with the gate of the FET E1 so that the gate of FET E1 is at the pinch-off voltage. FET E1 is then switched-on and connects the gate of the power-FET PT1 with the source of power-FET PT1 and thus reliably keeps the power-FET PT1 in switch-off state.

This situation persists as long as the controller C delivers the potential of the common drain node CD to the drain of limiter L21. In order to switch-on the power-FETs PT1, PT2, the controller C supplies a positive voltage, for example +10V to +15 V, to the drains of the power-FETs relative to the voltage at the common drain node CD. This causes switching-on of the power-FETs PT1, PT2 at the next zero voltage crossing of the AC voltage.

For illustration purposes, assume that the AC voltage drops over power-FET PT1 as described above. When the AC voltage reduces during the negative half-cycle, the voltage difference between the drain and gate of limiter L11 also reduces and thus this voltage appears at the source of limiter L11. Consequently, the voltage drop over R reduces and the FET E1 is switched-off so that the gate of power-FET PT1 is disconnected from the source of the power-FET PT1. When the voltage at the source of the power-FET PT1 becomes small (the negative half-cycle approaches zero) limiter L21 having its drain at +10V to +15V connects the gate of the power-FET PT1 with output O of the controller C. Hence, the gate of power-FET PT1 is at +15V and the power-FET PT1 is switched-on.

Figure 5:
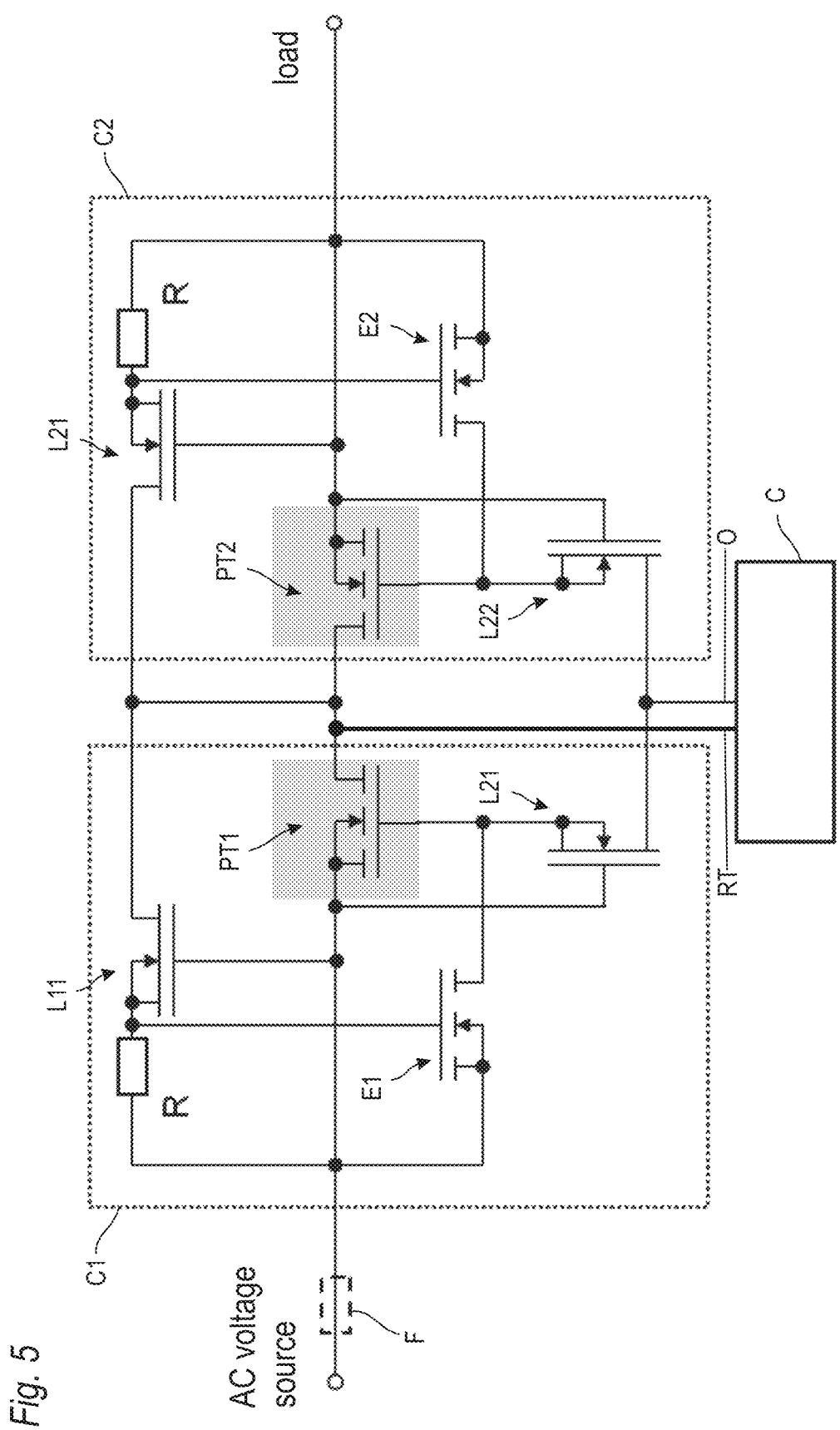
FIG. 5 illustrates a solid-state bidirectional switch having two power-MOSFETs with common drain node and voltage level-shifters according to an embodiment.

The configuration as illustrated in FIG. 5 does not need an input for the controller C for detecting zero voltage crossing since the level-shifter automatically switches when the AC voltage crosses zero. However, inputs might be added for detecting zero-current crossings for switching-off or for other communication or control purposes.

The above described operation is also valid for the positive half-cycle and then applies to the second power-FET PT2.

The bidirectional switch (or AC switch) as described herein exhibits comparably low losses, for example only 2 W at load currents of 16 $A_{eff}$. Hence, low on-state resistances are desired, for example 4 mΩ at 16 A, to allow integration into in-wall sockets, mounting rails or distribution boxes. The resulting voltage drop between the source and drain of each power-FET is thus only 64 mV which is significantly lower than the typical gate voltages of the power-FETs. If an RCCB is included, the power-FETs must be able to carry a cut-off current of 80 $A_{eff}$ and 200 $A_{eff}$, respectively, for 10 ms (duration of a half-cycle) before switching-off at the next zero current crossing. Such high cut-off currents are the result of the cut-off characteristic of the RCCB. Even in the case of a fivefold or a twelve-fold rated residual current, the drain-to-source voltage at the power-FETs is only about 0.8 V and remains significantly lower than the gate voltage. Hence, it is possible to relate the gate voltage by the controller C relative to the voltage at the common drain node CD as described above.

The bidirectional switches are not limited to single-phase switches but also include double or multiple phase switches. For example, three-phase AC currents can be reliably switched when using one bidirectional switch as described herein for each phase.

Figure 4:
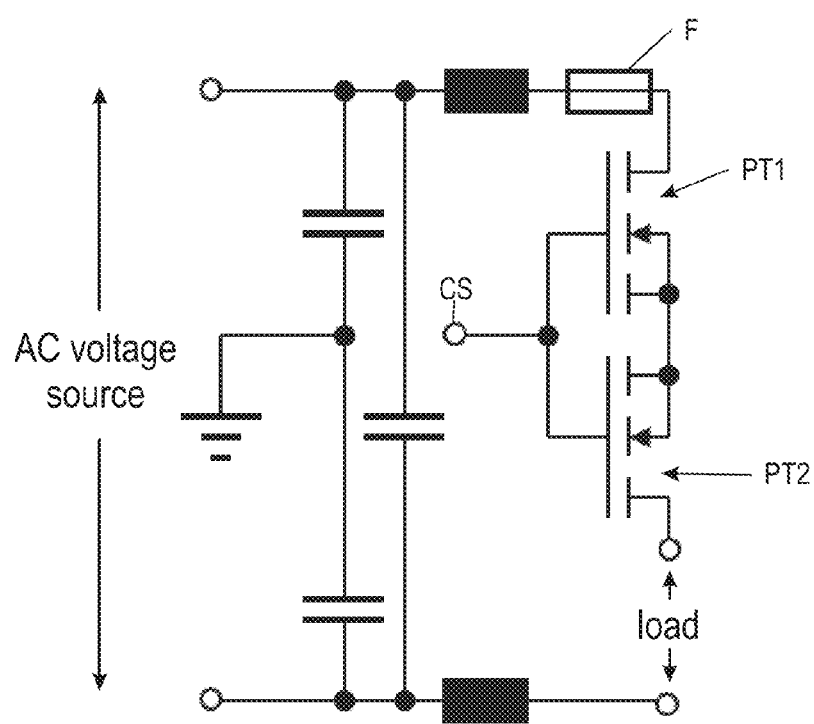
FIG. 4 illustrates a bidirectional switch having optional passive filter elements according to an embodiment.

The bidirectional switch can be furthermore supplemented with optional passive filter-elements and fuse elements as illustrated in FIG. 4. The bidirectional switch according this embodiment includes, in addition to the two power-FETs PT1, PT2, a fuse F and filter elements embodied as capacitors and resistors to improve EMC (Electromagnetic compatibility) and to reduce feedback of the load onto the grid. This is beneficial particularly in those cases when the bidirectional switch includes an integrated dimmer functionality.

Figure 6:
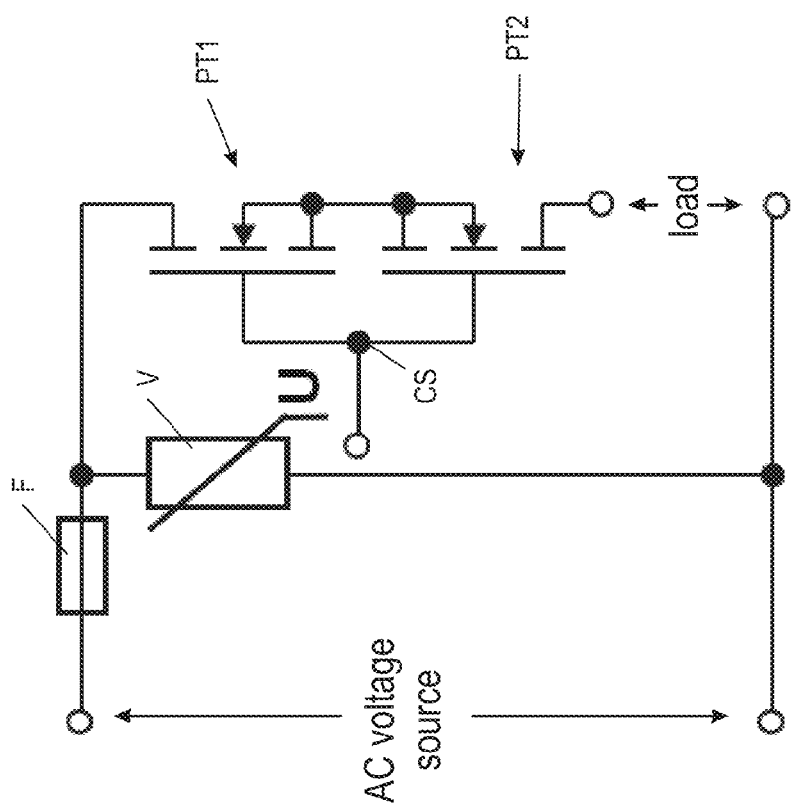
FIG. 6 illustrates a bidirectional switch with an optional varistor used as over-voltage protection element according to an embodiment.
Figure 7:
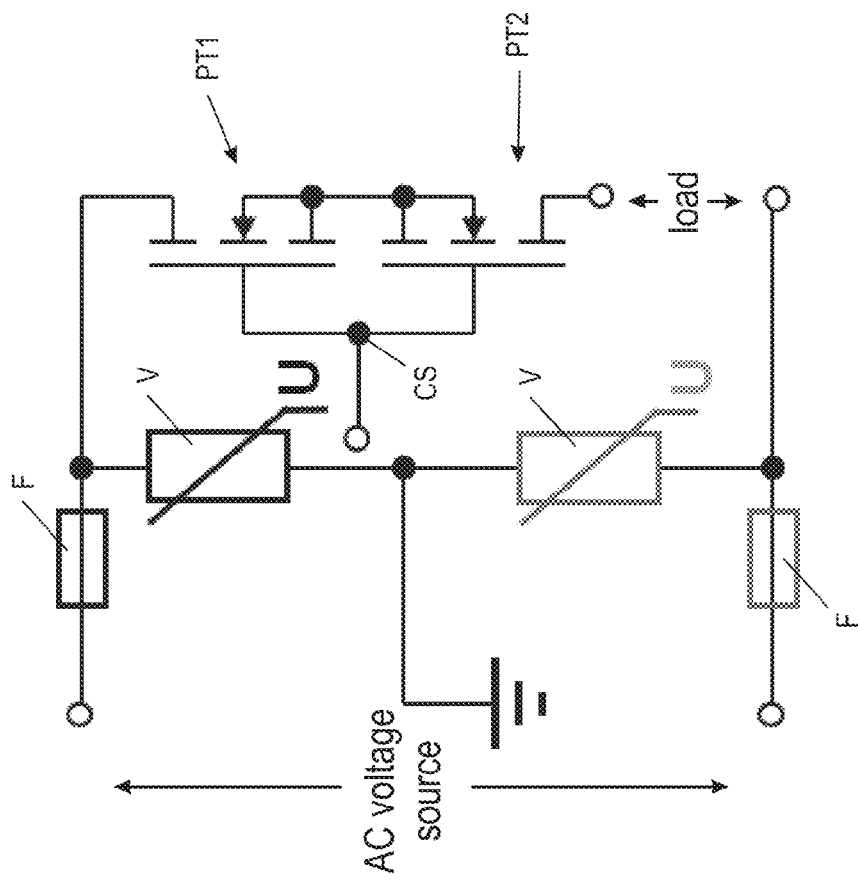
FIG. 7 illustrates a bidirectional switch with an optional varistor used as over-voltage protection element according to an embodiment.

FIGS. 6 and 7 illustrate further embodiments of bidirectional switches. These switches include varistors V as overvoltage protection elements in different configurations. The embodiment of FIG. 6 includes the varistor V between one phase and ground with an optional fuse F. Two varistors V in a symmetrical configuration (each between a phase and ground) or only one varistor V (between one phase and ground) can be used as illustrated in FIG. 6. FIG. 7 illustrates an embodiment with one varistor V between the two phases of the grid with an optional fuse F. FIGS. 6 and 7 show anti-serial connected power FETs PT1, PT2 with a common source as an example. However, different configurations with anti-serial power FETs may also be used.

The bidirectional switch can be used to switch e.g. household appliances or other electric or electronic equipment. Due to the integrated controller, the bidirectional switch can be remotely controlled by low voltage signals. This allows the integration into building automations which increasingly becomes popular. For example, the increasing integration of the electronic equipment into buildings such as motors, pumps and compressors of thermal heat pumps demands a dedicated control of those components. Such a control can be provided with the solid-state bidirectional switches as described herein.

When switching such loads, an adaptive switching behaviour might be desired, which is exemplified in FIG. 8. For example, during switching-on it might be desired to apply switching-off threshold which is higher than the rated current (permitted permanent current) to prevent that the bidirectional switch switches off due to transient high currents e.g. during start-up of a motor. This will be illustrated below.

When the load current exceeds the rated current (allowed maximum current) by a given factor, for example by factor 2 or 3, the switch shall disconnect at the next zero current crossing. On the other hand, when the load current exceeds the rated current but remains below the two-fold or three-fold rated current, the switch shall remain in the on-state for the time being. With progressing time (in terms of half cycles) the allowed exceedance of the rated current will be reduced to avoid that the load current is permanently above the rated current. The switching threshold is therefore dynamically adapted. This is illustrated in FIG. 8 by the descending dotted, dashed or solid lines symbolising different tripping characteristics. This characteristic is labelled "switch releases connection" which shows the maximum allowable current at a given half-cycle after the first occurrence of an over-current. Up to this line, the bidirectional switch keeps the connection and disconnects, i.e. switches off, only when this current exceeds this line. The maximum allowable over-current can be reduced step-wise as indicated in FIG. 8. Of course the curve shown is only an example. The time line may be significantly stretched to last over a bigger part of a second, a second or even a few seconds.

The logic for this operation can be integrated into the controller which may include a microprocessor and a memory. This also allows an adaptation of the bidirectional switch for different purposes. The configurable switching characteristics, as illustrated in FIG. 8 by the different lines (linearly descending line, stepped line, convex-curved line or concave-curved line) may be pre-defined and stored in the controller. The switching characteristics can be changed or adapted for different purposes during use.

Hence, according to an embodiment, a solid-state bidirectional switch having two power-FETs in anti-serial connection forming a common node and a controller connected with the common node has a configurable switching characteristic. The switching characteristic is defined by the controller and can be changed.

When the bidirectional switch is embodied as an RCCB, it is possible to integrate or to control a relay, which switches all phases, to completely galvanically disconnect the switched appliance or loads from the grid. Since the relay switches at zero current, it is possible to realise the relay comparably simple and with comparably long switching delay. The costs for such relays are thus reduced.

The bidirectional switch has also the benefit that personal protection can be ensured even in cases where appliances are switched which require a higher residual current. Examples are devices or appliances with filter elements, for example Y-capacitors as mains filter between phase and ground line or earth line. Those devices may have a larger current during switching on. The bidirectional switch can be adapted to have a retarded disconnecting behaviour during switching on, for example as described above. The allowable rated current can be set by the controller, either permanently or temporarily, at a larger value, and/or the cut-off delay can be set at a large value. In so doing, the operation of the appliance can be guaranteed while maintaining the desired level of personal protection. An example is the temporary use of an electric hand tool. During use of this tool, the sensitivity and/or the cut-off delay of the switch might be adapted and then returned to normal values after use.

Alternatively or in addition, it would also be possible to set the cut-off threshold such that it slightly exceeds the permanent load current of the tool or appliance so that even a slight exceedance of this load current causes the bidirectional switch to cut-off the connection.

The controller of the bidirectional switch can be remotely controlled in any known manner, for example through the grid, so that a switching can be effectively remotely performed without the need of additional wiring.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A solid-state bidirectional switch, comprising:
   a first and a second power field-effect transistor electrically connected anti-serial with each other, each of the first and second power field-effect transistors comprising:
      a source region;
      a drain region;
      a body region forming a pn-junction with the source region and comprising an inversion channel region;
      a drift region between the body region and the drain region and comprising an accumulation channel region;
      a drift control region adjacent to the accumulation channel region, the accumulation channel region being controllable through the drift control region; and
      a gate terminal; and
   a controller connected with the gate terminals of the first and second power field-effect transistors.

2. The solid-state bidirectional switch of claim 1, wherein each of the first and second power field-effect transistors further comprises a gate electrode adjacent to the inversion channel region of the body region and a gate dielectric between the inversion channel region and the gate electrode, and an accumulation dielectric between the drift control region and the accumulation channel region, wherein the gate electrode is electrically connected with the gate terminal.

3. The solid-state bidirectional switch of claim 1, wherein each of the first and second power field-effect transistors further comprises an accumulation dielectric between the drift control region and the accumulation channel region, wherein the drift control region is connected with the gate terminal and operable to control both the inversion channel region and the accumulation channel region.

4. The solid-state bidirectional switch of claim 1, wherein the controller is electrically connected with a common node of the first and second power field-effect transistors.

5. The solid-state bidirectional switch of claim 1, wherein each of the first and second power-field effect transistors is integrated in a separate semiconductor chip.

6. The solid-state bidirectional switch of claim 2, wherein
   the gate electrode and the drift control region of the first power-field effect transistor are electrically connected with each other, and
   the gate electrode and the drift control region of the second power-field effect transistor are electrically connected with each other.

7. The solid-state bidirectional switch of claim 1, wherein the source regions of the first and second power field-effect transistors are electrically connected with each other to form a common source node, and wherein the controller comprises a reference terminal electrically connected with the common source node.

8. The solid-state bidirectional switch of claim 7, wherein the controller comprises at least one output terminal electrically connected with the gate terminals of the first and second power field-effect transistors.

9. The solid-state bidirectional switch of claim 8, wherein
   the controller further comprises a first and a second input terminal; and
   the solid-state bidirectional switch further comprises:
      a first non-linear voltage limiting element connecting the drain region of the first power field-effect transistor with the first input terminal of the controller; and
      a second non-linear voltage limiting element connecting the drain region of the second power field-effect transistor with the second input terminal of the controller.

10. The solid-state bidirectional switch of claim 9, wherein each of the first and second non-linear voltage limiting elements comprises:
   a source region of a first conductivity type;
   a drain region of the first conductivity type;
   a drift region of the first conductivity type comprising a channel region of the first conductivity type, wherein the drift region electrically connects the source region with the drain region; and
   a gate electrode arranged at opposite sides of the channel region and operable to control a resistivity of the channel region.

11. The solid-state bidirectional switch of claim 10, wherein
   the gate electrodes of the first and second non-linear voltage limiting elements are electrically connected with the common source node;
   the drain region of the first non-linear voltage limiting element is electrically connected with the drain region of the first power field-effect transistor;
   the drain region of the second non-linear voltage limiting element is electrically connected with the drain region of the second power field-effect transistor;
   the source region of the first non-linear voltage limiting element is electrically connected with the first input terminal of the controller; and
   the source region of the second non-linear voltage limiting element is electrically connected with the second input terminal of the controller.

12. The solid-state bidirectional switch of claim 1, wherein the drain regions of the first and second power field-effect transistors are electrically connected with each other to form a common drain node.

13. The solid-state bidirectional switch of claim 12, wherein the controller comprises a reference terminal electrically connected with the common drain node.

14. The solid-state bidirectional switch of claim 13, wherein
   the controller further comprises at least one output terminal; and the solid-state bidirectional switch further comprises:
a first level-shifter connecting the at least one output terminal of the controller with the gate terminal of the first power field-effect transistor; and
a second level-shifter connecting the at least one output terminal of the controller with the gate terminal of the second power field-effect transistor.

15. The solid-state bidirectional switch of claim 14, wherein each of the first and second level-shifter comprises a non-linear voltage limiting element.

16. The solid-state bidirectional switch of claim 1, wherein the controller comprises at least one control input.

17. A solid-state bidirectional switch, comprising:
a first and a second power field-effect transistor each comprising a source terminal, a gate terminal, and a drain terminal, the source terminals of the first and second power field-effect transistors being electrically connected with each other to form a common source node;
a controller comprising at least one output terminal electrically connected with the gate terminals of the first and second power field-effect transistors, a reference terminal electrically connected with the common source node, and a first and a second input terminal;
a first non-linear voltage limiting element connecting the drain terminal of the first power field-effect transistor with the first input terminal of the controller; and
a second non-linear voltage limiting element connecting the drain terminal of the second power field-effect transistor with the second input terminal of the controller.

18. The solid-state bidirectional switch of claim 17, wherein each of the first and second non-linear voltage limiting elements comprises an input terminal, a control terminal, and an output terminal, wherein each of the first and second non-linear voltage limiting elements is configured to limit an input voltage, which is supplied to the input terminal, to an maximum output voltage, which is presented at the output terminal, depending on a control voltage supplied to the control terminal.

19. The solid-state bidirectional switch of claim 17, further comprising a first semiconductor chip and a second semiconductor chip separate from the first semiconductor chip, wherein
the first power field-effect transistor and the first non-linear voltage limiting element are integrated in the first semiconductor chip, and
the second power field-effect transistor and the second non-linear voltage limiting element are integrated in the second semiconductor chip.

20. A solid-state bidirectional switch, comprising:
a first and a second power field-effect transistor each comprising a source terminal, a gate terminal, and a drain terminal, the drain terminals of the first and second power field-effect transistors being electrically connected with each other to form a common drain node;
a controller comprising a reference terminal electrically connected with the common drain node and at least one output terminal;
a first level-shifter connecting the at least one output terminal of the controller with the gate terminal of the first power field-effect transistor; and
a second level-shifter connecting the at least one output terminal of the controller with the gate terminal of the second power field-effect transistor.

21. The solid-state bidirectional switch of claim 20, further comprising a first semiconductor chip and a second semiconductor chip separate from the first semiconductor chip, wherein
the first power field-effect transistor and the first level-shifter are integrated in the first semiconductor chip, and
the second power field-effect transistor and the second level-shifter element are integrated in the second semiconductor chip.

22. A solid-state bidirectional switch, comprising:
a common lead frame comprising a metal layer;
a first and a second power field-effect transistor each comprising a source metallization, a gate metallization, and a drain metallization, the drain metallizations of the first and second power field-effect transistors being in contact with the metal layer of the common lead frame; and
a controller comprising at least one reference terminal electrically connected with the metal layer of the common lead frame, and an output terminal insulated from the metal layer of the common lead frame and operable to control the first and second power field-effect transistors.

23. The solid-state bidirectional switch of claim 22, wherein the first and second power field effect transistors are integrated in separate semiconductor chips.

24. The solid-state bidirectional switch of claim 23, wherein each of the separate semiconductor chips are embedded in a moulding material, and wherein a fuse is embedded in the moulding material of each semiconductor chip.

25. The solid-state bidirectional switch of claim 22, wherein at least two of the following elements selected from the group consisting of the first power field effect transistor, the second power field effect transistor and the controller are monolithically integrated into the same chip.

26. A solid-state bidirectional switch, comprising:
at least two power field-effect transistor in anti-serial connection to have a common node, each of the power field-effect transistor comprising a controllable vertical inversion channel and a vertical accumulation channel controllable by a drift control region;
a controller for providing a common control signal to control the least two power field-effect transistor; and
wherein the solid-state bidirectional switch is operable to switch alternating voltages and currents.

27. The solid-state bidirectional switch of claim 26, further comprising one of:
a body region and a drift region forming a pn-junction, a gate dielectric, and a gate electrode adjacent to the body region comprising the vertical inversion channel adjacent to the gate dielectric which insulates the body region from the gate electrode, wherein the inversion channel is controllable through the gate electrode, and wherein the gate electrode is electrically connected with the gate terminal; and
a body region and a drift region forming a pn-junction, and an accumulation dielectric electrically insulating the drift control region from the body region and the drift region, wherein the drift control region is electrically connected with the gate terminal and controls the vertical accumulation channel formed in the drift region adjacent to the accumulation dielectric and the inversion channel region formed in the body region adjacent to the gate dielectric.

* * * * *